(12) United States Patent
Yanagihara et al.

(10) Patent No.: US 7,569,870 B2
(45) Date of Patent: Aug. 4, 2009

(54) GALLIUM-NITRIDE-BASED COMPOUND SEMICONDUCTOR DEVICE

(75) Inventors: Masataka Yanagihara, Niiza (JP); Masahiro Sato, Niiza (JP); Tetsuji Moku, Niiza (JP)

(73) Assignee: Sanken Electric Co., Ltd. (JP)

( * ) Notice: Subject to any disclaimer, the term of this patent is extended or adjusted under 35 U.S.C. 154(b) by 80 days.

(21) Appl. No.: 11/182,656

(22) Filed: Jul. 15, 2005

(65) Prior Publication Data

US 2005/0263791 A1 Dec. 1, 2005

Related U.S. Application Data

(63) Continuation of application No. PCT/JP2004/000183, filed on Jan. 14, 2004.

(30) Foreign Application Priority Data

Jan. 17, 2003 (JP) .............................. 2003-010168

(51) Int. Cl.
H01L 31/072 (2006.01)
H01L 29/739 (2006.01)
(52) U.S. Cl. ...................................... 257/192; 257/194
(58) Field of Classification Search ................. 257/183, 257/191–194, E29.246, E29.247, E29.248, 257/E29.252
See application file for complete search history.

(56) References Cited

U.S. PATENT DOCUMENTS

| 5,596,211 | A | * | 1/1997 | Onda et al. | 257/194 |
| 7,253,454 | B2 | * | 8/2007 | Saxler | 257/194 |
| 2002/0096692 | A1 | | 7/2002 | Nakamura et al. | 257/194 |
| 2007/0205433 | A1 | * | 9/2007 | Parikh et al. | 257/192 |

FOREIGN PATENT DOCUMENTS

| JP | 11-177142 | | 7/1999 |
| JP | 2000-277441 | | 10/2000 |
| JP | 2001-274376 | | 10/2001 |
| JP | 2003-059948 | * | 2/2003 |

OTHER PUBLICATIONS

Cordier, Y. et al., "AlGaN/GaN HEMTs on Resistive Si(111) Substrate Grown by Gas-Source MBE", *Electronic Letters*, 2002, 38(2), 91-92.

* cited by examiner

*Primary Examiner*—Hung Vu
(74) *Attorney, Agent, or Firm*—Woodcock Washburn LLP (57) ABSTRACT

A semiconductor device having nitride semiconductor layers has a buffer layer (2) in the form of alternations of a first sublayer (8) of AlN and a second layer (9) of GaN with interposition of a third layer (10) of p-type GaN therebetween. On this buffer layer there is grown a main semiconductor region (3) having nitride semiconductor layers for providing a high-electron-mobility transistor or the like. From 0.5 to 50.0 nanometers thick, the third sublayers (10) of the buffer layer restrict the generation of two-dimensional electron gas and so prevent the buffer layer from becoming unnecessarily low in resistance.

17 Claims, 4 Drawing Sheets

GALLIUM-NITRIDE-BASED COMPOUND SEMICONDUCTOR DEVICE

CROSS REFERNCE TO RELATED APPLICATIONS

This is a continuation of Application PCT/JP2004/000183, filed Jan. 14, 2004, which claims priority to Japanese Patent Application No. 2003-010168 filed Jan. 17, 2003.

BACKGROUND OF THE INVENTION

This invention relates to semiconductor devices such as metal semiconductor field effect transistors (MESFETs) and high electron mobility transistors (HEMTs) and to a method of fabricating such semiconductor devices.

Semiconductor devices have been known which use gallium-nitride-based compound semiconductors, examples being MESFETs and HEMTs.

In a typical prior art semiconductor device using gallium-nitride-based compound semiconductors, the compound semiconductor region is formed on an electrically insulating substrate of sapphire via a low-temperature buffer layer of GaN or AlN, the latter having been formed with a relatively low substrate temperature of approximately 500° to 600° C.

More specifically, in the case of a MESFET, a working layer known as the channel layer of silicon-doped n-type GaN is formed on an insulating sapphire substrate via a low-temperature buffer layer of GaN or AlN. The source, drain and gate electrodes are formed on the surface of the working layer.

In the case of a HEMT, on the other hand, an electron transit layer or channel layer of undoped GaN and an electron supply layer of n-type AlGaN are formed on an insulating sapphire substrate via a low-temperature buffer layer of GaN or AlN. The source, drain and gate electrodes are formed on the surface of the electron supply layer.

One of the problems encountered with the sapphire substrate is its hardness, which made dicing very difficult and inefficient. Another problem is the expensiveness of sapphire, which added substantively to the manufacturing costs of the semiconductor devices concerned.

Still another problem with the sapphire substrate is its low heat conductivity, 0.126 W/cm·K. Incapable of sufficiently liberating the heat developing during operation of the device, the sapphire substrate deteriorated the performance characteristics of the device such as voltage-withstanding capability and gain.

A further problem manifested itself in conjunction with the heterojunction of the prior art HEMT constituted of GaN and AlGaN layers. As a result, the AlGaN layer inherently possessed a tensile stress or tensile strain due to lattice mismatch between the GaN and AlGaN layers. The tensile stress gave rise to piezoelectric depolarization at the interface between the GaN and AlGaN layers. Combined the spontaneous depolarization, the piezoelectric depolarization produced an electric field of the order of several megavolts per centimeter at the heterojunction interface between the GaN and AlGaN layers. The electric field created in turn two-dimensional electron gas of the order of $10^{13}$ cm$^{-2}$ in the channel layer, causing a decrease in the sheet resistance of the channel layer and, in consequence, an increase in the amount of drain current. The reduced sheet resistance of the channel layer due to the two-dimensional electron gas is an admitted strength of the HEMT having the GaN—AlGaN heterojunction.

Running counter to the noted advantage of the HEMT is the fact that the sapphire substrate is easy to expand thermally, sapphire being higher in coefficient of thermal expansion than nitride semiconductors. This difference in thermal expansion coefficient gave rise to compressive stress on the epitaxially grown layers. Such compressive stresses lessened the piezoelectric depolarization by working in a direction to cancel the tensile stress in the AlGaN layer due to its lattice mismatch with the GaN layer. The result was a drop in the electron density of the two-dimensional electron gas in the channel layer, preventing the GaN-AlGaN heterojunction HEMT from exhibiting its strength to the full.

In an attempt to solve the problems discussed above, both Japanese Unexamined Patent Publication No. 2001-274376 and Japanese Patent Application No. 2001-248735 suggest use of a silicon substrate in lieu of a sapphire one. The second recited reference further teaches the compositions of a buffer layer to be formed on the silicon substrate, in order to create a nitride semiconductor region of favorable crystallinity on the buffer layer. The buffer layer taught is a lamination of two different kinds of sublayers. One of these kinds of sublayers is fabricated from a class of substances generally defined as:

where M is at least either of indium (In) and boron (B); $0<x\leq1$; $0\leq y<1$; and $x+y\leq1$. The other kind of buffer sublayer is fabricated from a class of substances generally defined as:

where M is at least either of In and B; $0\leq a<1$; $0\leq b\leq1$; $a+b\leq1$; and $a<x$.

The first kind of buffer sublayer with its relatively high aluminum content has a lattice constant intermediate the lattice constants of silicon and nitride semiconductors. As a consequence, with the nitride semiconductor region formed on the silicon substrate via the laminated buffer sublayers as taught by the prior art, the buffer layer faithfully conforms to the crystal orientation of the silicon substrate. The nitride semiconductor region also faithfully conforms to the crystal orientation of the buffer layer.

However, when a buffer layer is constituted of alternations of an AlN or AlGaN sublayer and a GaN sublayer, two-dimensional electron gas layers are created at the heterojunction interfaces between the AlN or AlGaN sublayers and GaN sublayers. These two-dimensional electron gas layers are so low in resistance that the HEMT having a buffer layer of such alternating sublayers has current paths through the buffer layer in addition to the drain current path through the channel layer. The current paths through the buffer layer provide leakage current paths between the source and drain when the gate is off, inviting a rise in current leakage which is unnecessary in semiconductor devices. Furthermore, the voltage withstanding capability of semiconductor devices depends upon current leakage. A semiconductor device is less in voltage withstanding capability the greater its current leakage. Current leakage will lessen if the electron transit layer of undoped GaN has fewer crystal defects. As of today, however, no practical measures are available for reduction of crystal defects in the electron transit layer. It might be contemplated to render the electron transit layer higher in resistance either by making this layer thicker or by doping with a p-type impurity the electron transit layer of GaN which possesses an n-like conductivity type even though it has been undoped. These methods are objectionable because the gallium-nitride-based semiconductors would be so stressed as to develop cracks, resulting in poor performance of the semiconductor devices.

The above discussed inconveniences with current leakage manifest themselves with semiconductor devices other than HEMTs.

SUMMARY OF THE INVENTION

It is therefore an object of this invention to provide semiconductor devices free from the noted problems of the prior art, and a method of making such semiconductor devices.

For the attainment of the foregoing object the present invention provides a semiconductor device comprising a substrate of silicon or a silicon compound, a buffer layer on one of the opposite major surfaces of the substrate, and a main semiconductor region having at least one nitride semiconductor layer formed on the buffer layer for providing a semiconductor element. The buffer layer comprises a first sublayer of a nitride semiconductor containing aluminum in a first proportion, a second sublayer of a nitride semiconductor containing aluminum in a second proportion that is either zero or less than the first proportion, and a third sublayer interposed between the first and the second sublayer and made from a substance capable of restricting the generation of two-dimensional electron gas. The term "semiconductor device" as used herein should be construed to mean not only the semiconductor device in completed form but a semiconductor element not yet furnished with electrodes, a semiconductor wafer and so forth.

The first sublayer of the buffer layer is preferably fabricated from substances that are generally defined as:

$$Al_xM_yGa_{1-x-y}N$$

where:
Al=aluminum;
M=at least either of In and B;
Ga=gallium;
N=nitrogen;
$0<x\leq1$;
$0\leq y<1$; and
$x+y\leq1$.

Having a lattice constant intermediate the lattice constants of silicon and GaN, the first buffer sublayer favorably conforms in lattice constant to the substrate. The main semiconductor region for the desired semiconductor element may therefore be formed on the buffer layer with their crystal orientation aligned. The main semiconductor region is favorable in levelness or evenness, which leads to improvements in the electrical characteristics of the semiconductor device. Should the buffer layer be fabricated on the silicon substrate from a GaN semiconductor alone at low temperatures, a main semiconductor region of desired flatness would not be created on the buffer layer by reason of the great difference in lattice constant between silicon and GaN.

The second sublayer of the buffer layer is preferably fabricated from substances that are generally defined as:

$$Al_aM_bGa_{1-a-b}N$$

where:
Al=aluminum;
M=at least either of In and B;
Ga=gallium;
N=nitrogen;
$0\leq a<1$;
$0\leq b\leq1$;
$a+b\leq1$; and
$a<x$.

The third sublayer is preferably from 0.5 to 50.0 nanometers thick. With the third sublayer limited to this range of thicknesses, less cracks will develop from the straining of the main semiconductor region, with consequent improvement in the electrical characteristics of the semiconductor device.

The first buffer sublayer may be of $Al_xGa_{1-x}N$, and the second buffer sublayer of $Al_aGa_{1-a}N$.

Alternatively, the first buffer sublayer may be of $Al_xIn_yGa_{1-x-y}N$, and the second buffer sublayer of $Al_aIn_bGa_{1-a-b}N$, with indium contained in at least either of the two sublayers. The addition of indium to either or both of the two buffer sublayers will further mitigate the stresses acting between the substrate and the buffer layer. Fabricated from any of such indium-nitride-based compound semiconductors as InN, InGaN, AlInN, and AlInGaN, either or both of the two buffer sublayers will be closer in thermal expansion coefficient to the substrate of silicon or silicon compound than when made from other nitride semiconductors not containing indium, such as GaN and AlN. The buffer layer will therefore be saved from straining as a result of its difference in thermal expansion coefficient from the substrate.

As another alternative, the first buffer sublayer may be of $Al_xB_yGa_{1-x-y}N$, and the second buffer sublayer of $Al_aB_bGa_{1-a-b}N$, with boron contained in at least either of the two sublayers. The boron content in either or both of the two buffer sublayers will made the buffer layer closer in thermal expansion coefficient to the substrate of silicon or silicon compound than the buffer layer with no boron content. The buffer layer will therefore be saved from straining as a result of its difference in thermal expansion coefficient from the substrate.

The first buffer sublayer may be less in lattice constant than the second buffer sublayer.

The third buffer sublayer may be less thick than the first buffer sublayer.

The third buffer sublayer may be of the same semiconductor material as the second buffer sublayer, plus a p-type impurity by way of conductivity type determination. The third buffer sublayer with its p-type impurity contacts the first buffer sublayer in replacement of the second. Two-dimensional electron gas will therefore generate in this third buffer sublayer. However, as the p-type impurities contained in the third buffer sublayer compensate for the electrons generated therein, the carrier density or electron density will drop in the buffer sublayer. The third buffer sublayer would be incapable of restricting the two-dimensional electron gas if made from the same semiconductor material as the first buffer sublayer plus a p-type impurity.

The third buffer sublayer may also be an insulating layer that is from 0.5 to 5.0 nanometers, preferably from 0.5 to 2.0 nanometers, thick.

The insulating layer may be made from either one or more of silicon nitride (SiN), silicon oxide ($SiO_2$), aluminum oxide ($Al_2O_3$), titanium oxide ($Ti_2O_3$), zirconium oxide ($ZrO_2$), and tantalum oxide ($Ta_2O_3$). An insulating film of any of these substances will mitigate the strain of the second buffer sublayer and restrict the generation of two-dimensional electron gas.

The buffer layer may preferably comprise a plurality of first buffer sublayers, a plurality of second buffer sublayers, and at least one third buffer sublayer. The first and the second buffer sublayers may alternate, and the third buffer sublayer may be interposed between at least one pair of first and second buffer sublayers. The alternate arrangement of the first and the second buffer sublayers is tantamount to a stacking of a plurality or multiplicity of thin buffer sublayers, so that the buffer layer as a whole favorably performs its buffering function, assuring good crystallinity for the main semiconductor region formed thereon.

The third buffer sublayer may be positioned between one second buffer sublayer and the overlying first buffer sublayer, and not between one second buffer sublayer and the underlying first buffer sublayer.

The first buffer sublayer may be from 0.5 to 50.0 nanometers thick, and the second buffer sublayer from 0.5 to 200.0 nanometers thick. Constituted of the first and second buffer sublayers in such preferred ranges of thicknesses, the buffer layer will be more conducive to the creation of a main semiconductor region of improved flatness.

The surface of the substrate on which is formed the buffer layer is preferably exactly (111), or plus or minus four degrees therefrom, in terms of Miller indices. The substrate with the surface of such crystal face orientation will enable the creation thereon of the buffer layer and main semiconductor region with little or no atomic steps, that is, steps as viewed on the order of atoms. Formed on a substrate surface that deviates from (111) beyond the above defined range, the buffer layer and main semiconductor region would create atomic steps that, though of no serious consequence if the epitaxially grown layers were relatively thick, could deteriorate the performance of semiconductor devices having thinner epitaxial layers. These steps are reducible by making the substrate surface (111) or thereabouts.

The nitride semiconductor layer of the main semiconductor region may be of either gallium nitride (GaN), aluminum indium nitride (AlInN), aluminum gallium nitride (AlGaN), indium gallium nitride (InGaN), and aluminum indium gallium nitride (AlInGaN).

Two main electrodes and a control electrode may be formed on the main semiconductor region.

The main semiconductor region may be configured for provision of a HEMT or a field effect transistor such as a MESFET. In such cases the noted main electrodes and control electrode take the forms of a source, a drain and a gate, respectively.

The invention also provides a method of making a semiconductor device having nitride semiconductor layers, whereby semiconductor devices of good characteristics are manufacturable both inexpensively and easily. The method comprises:

providing a substrate of silicon or a silicon compound;
  forming a buffer layer on the substrate by a vapor-phase growth method, the buffer layer comprising a first sublayer of a nitride semiconductor containing aluminum in a first proportion, a second sublayer of a nitride semiconductor containing aluminum in a second proportion which is either zero or less than the first proportion, and a third sublayer which is interposed between the first and the second sublayer and which is made from a substance capable of restricting the generation of two-dimensional electron gas; and
  forming a main semiconductor region on the buffer layer by a vapor-phase growth method, the main semiconductor region comprising at least one nitride semiconductor layer.

As the buffer layer according to the present invention has the third sublayer interposed between the first and the second sublayer for restriction of two-dimensional electron gas, the amount of two-dimensional electron gas generated is reduced to zero or less than that according to the prior art in which the first and the second sublayer are in direct contact with each other. The buffer layer is thus prevented from becoming low in resistance, with the result that there is little or no current flow of leakage current through the buffer layer. The semiconductor device is enabled to withstand higher voltages than heretofore.

DESCRIPTION OF THE PREFERRED EMBODIMENTS

First Embodiment

The invention will now be described in terms of the HEMT using gallium-nitride-based compound semiconductors according to the invention, with reference had to FIGS. 1-3.

Figure 1:
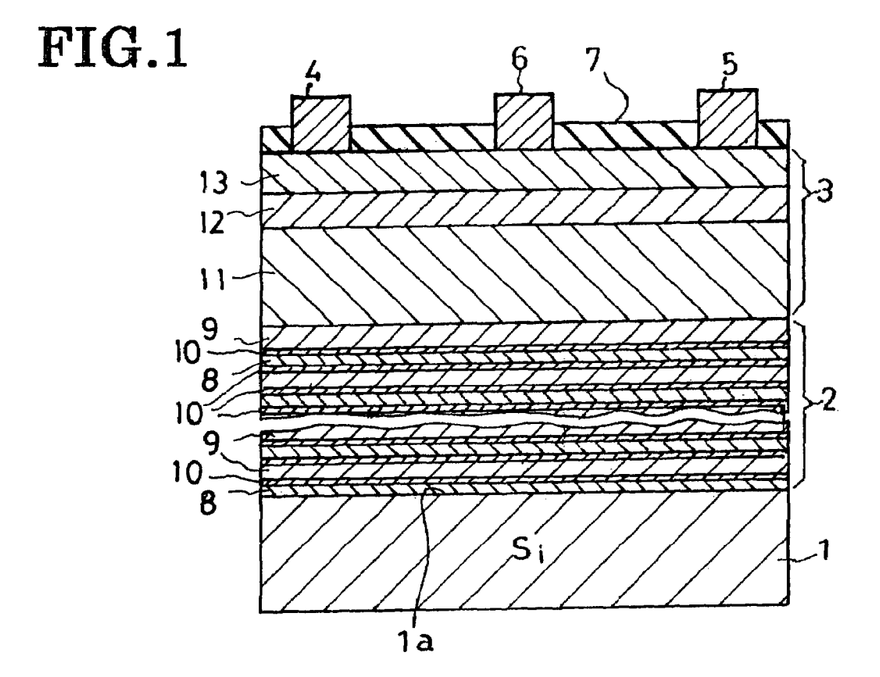
FIG. 1 is a schematic vertical section through a HEMT shown by way of a first preferred embodiment of the instant invention.
Figure 2:
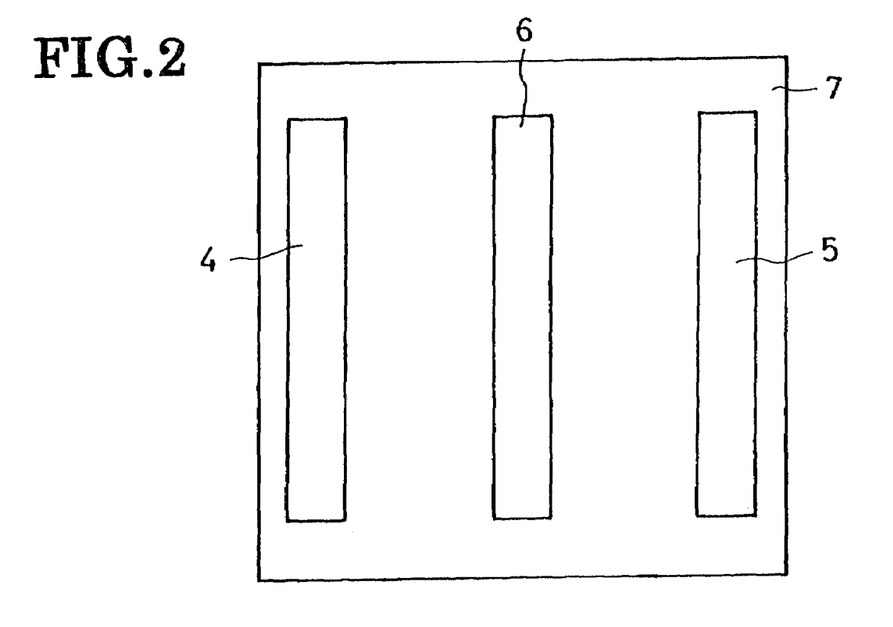
FIG. 2 is a top plan of the HEMT of FIG. 1.

With reference first to FIG. 1 the HEMT embodying the invention comprises a silicon substrate 1, a buffer layer 2, a main semiconductor region 3 constituting the primary working part of the HEMT, a first electrode or source 4, a second electrode or drain 5, a control electrode or gate 6, and an insulating film 7.

The substrate 1 is a single crystal of p-type silicon containing boron or other Group III element as a conductivity type determinant. The major surface $1_a$ of the substrate 1, on which there is grown the buffer layer 2, is exactly (111) in terms of Miller indices indicative of crystal face orientation. The impurity concentration of the substrate 1 is set as low as, for example, from $1 \times 10^{12}$ cm$^{-3}$ to $1 \times 10^{14}$ cm$^{-3}$ with a view to the reduction of leakage current through the substrate. The resistivity of the substrate 1 on the other hand is as high as, for example, 100 to 10000 ohm·cm. The substrate 1 is approximately 500 micrometers in thickness, which is enough to provide mechanical support for the buffer layer 2 and semiconductor region 3.

The buffer layer 2, which might also be termed a buffer region, overlying the complete major surface of the substrate 1 takes the form of the alternations of a first sublayer 8, a second sublayer 9, and a third sublayer 10 between the first and second sublayers. Although shown partly broken away in FIG. 1, the buffer layer 2 has as many as twenty first sublayers 8, twenty second sublayers 9, and thirty-nine third sublayers 10. Speaking generally, there may be provided from two to two hundreds, preferably from twenty to eighty, first and second sublayers 8 and 9.

The first buffer sublayers 8 are made from substances that are generally defined as:

$$Al_xM_yGa_{1-x-y}N$$

where:
M=at least either of In and B;
$0<x\leq1$;
$0\leq y<1$; and
$x+y\leq1$.

In other words the first buffer sublayers 8 are made from a nitride containing aluminum at least, examples being aluminum nitride (AlN), aluminum indium nitride (AlInN), aluminum gallium nitride (AlGaN), aluminum indium gallium nitride (AlInGaN), aluminum boron nitride (AlBN), aluminum boron gallium nitride (AlBGaN), and aluminum boron indium gallium nitride (AlBInGaN).

The first buffer sublayers 8 are closer in both lattice constant and thermal expansion coefficient to the silicon substrate 1 than are the second buffer sublayers 9. Preferably, the first buffer sublayers 8 are less in lattice constant than the second buffer sublayers 9.

The preferred thickness of the first sublayers 8 of the buffer layer 2 is from 0.5 to 50.0 nanometers, or from 5 to 500 angstroms. The main semiconductor region 3 might not be formed on the buffer layer 2 with a desired degree of flatness if the first buffer sublayers 8 were less than 0.5 nanometer thick. If the first buffer sublayers 8 were more than 50 nanometers thick, on the other hand, then the first buffer sublayers might develop cracks owing to lattice mismatch between the first and the second buffer sublayers 8 and 9 or to the difference in thermal expansion coefficient between the lowermost first buffer sublayer 8 and the substrate 1.

Preferably, the first buffer sublayers 8 are made from a narrower range of substances that are expressed as:

$$Al_xGa_{1-x}N$$

where x is greater than zero and equal to or less than one. In the embodiment shown in FIGS. 1 and 2 the first buffer sublayers 8 are made from AlN (x is 1 in the formula above).

The second buffer sublayers 9 are made from substances that are generally defined by the following formula and which are undoped with a conductivity type determinant:

$$Al_aM_bGa_{1-a-b}N$$

where:
M=at least either of In and B;
$0\leq a<1$;
$0\leq b\leq1$;
$a+b\leq1$; and
$a<x$.

Thus the second buffer sublayers may be made from any such substance as GaN, AlInN, AlGaN, AlInGaN, AlBN, AlBGaN, and AlBInGaN.

Preferably, the second buffer sublayers are made from either GaN or substances that are generally defined as:

$$Al_aGa_{1-a}N$$

where:
$0\leq a<1$; and
$a<x$.

In use of $Al_aGa_{1-a}N$ for the second buffer sublayers 9, the aluminum proportion a in the formula above should be greater than zero and less than 0.8 in order to preclude the development of cracks from an aluminum overproportion. It is also recommended that the aluminum proportion be less in the second buffer sublayers 9 than in the first buffer sublayers 8. The second buffer sublayers 9 are made from GaN (a is zero is the formula above) in this particular embodiment of the invention.

The preferred thickness of the second buffer sublayers 9 is from 0.5 to 200.0 nanometers or from five to 2000 angstroms. The first buffer sublayers 8 and the main semiconductor region 3 on the buffer layer 2 might not be grown with a desired degree of flatness if the second buffer sublayers 9 were less than 0.5 nanometer thick. Should the second buffer sublayers 9 exceed 200 nanometers in thickness, on the other hand, then the stress mitigation effect due to the combination of the first and second buffer sublayers 8 and 9 would deteriorate, with consequent development of cracks.

It is also preferred that the second buffer sublayers 9 be thicker than the first buffer sublayers 8. In this manner, in the face of lattice mismatch between the first and second buffer sublayers 8 and 9, and of a difference in thermal expansion coefficient between the lowermost first buffer sublayer 8 and substrate 1, the first buffer sublayers 8 will be strained only to such an extent that the first buffer sublayers 9 will not suffer cracks. The electron transit layer 11 of the main semiconductor region 3 will also be maintained in a high electron density.

The third buffer sublayers 10 are interposed one between every two neighboring first and second buffer sublayers 8 and 9 for precluding the generation of two-dimensional electron gas. The third buffer sublayers 10 may be made from the same semiconductor material as are the second buffer sublayers 9, such for example as GaN plus a p-type impurity such as Mg. The thickness of the third buffer sublayers 10 may range from 0.5 to 50 nanometers, preferably from one to five nanometers.

Were it not for the third buffer sublayers 10, two-dimensional gas layers would be created at the heterojunctions between the first and second buffer sublayers 8 and 9, resulting in a drop in the resistance of the buffer layer 2 as a whole and in a rise in the amount of leakage current. In contrast, according to the invention, the third buffer sublayers 10 with their p-type impurity content contact the first buffer sublayers 8 in replacement of the second buffer sublayers 9, providing locations for generation of two-dimensional electron gas. However, the p-type impurities contained in the third buffer sublayers 10 compensate for the electrons produced in the third buffer sublayers. The result will be a drop in the carrier or electron concentration of the third buffer sublayers 10 and therefore a rise in the resistance of the buffer layer 2. The third buffer sublayers 10 may be made less in thickness than the first and second buffer sublayers 8 and 9 for the best results.

FIG. 1 shows the third buffer sublayer 3 as disposed between every two neighboring first and second buffer sublayers 8 and 9. Alternatively, however, the third buffer sublayer 3 might be placed only between some of the neighboring pairs of first and second buffer sublayers 8 and 9 or even between only one of such pairs within the teachings instant of the invention.

The main semiconductor region 3 constituting the primary working parts of the HEMT comprises an electron transit layer 11 made for example from GaN undoped with impurities, a spacer layer 12 made for example from $Al_{0.2}Ga_{0.8}N$ undoped with impurities, and an electron supply layer 13 made for example from $Al_{0.2}Ga_{0.8}N$ doped with an n-type impurity of silicon. The constituent layers 11-13 of the main semiconductor region 3 are made from nitride semiconductors based upon nitrogen and gallium. The electron transit layer 11, which might also be called a channel layer, directly overlying the buffer layer 2, is 500 nanometers thick. On this electron transit layer 11 there is provided the spacer layer 12 which is seven nanometers thick and which serves to prevent the diffusion of silicon, the n-type impurity of the overlying electron supply layer 13, down into the electron transit layer 11. This spacer layer 12 is not an absolute requirement, however. The electron supply layer 13 is 30 nanometers thick and is desired to supply to the electron transit layer 11 the electrons generated from the donor impurities (n-type impurities).

Both source 4 and drain 5 make ohmic contact with the electron supply layer 13 whereas the gate 6 makes Schottky contact with the electron supply layer 13. Additional semiconductor layers with a high n-type impurity concentration could be inserted between the source 4 and drain 5 and the electron supply layer 13 for better contact. The insulating film 7, which may be of $SiO_2$, covers the surface of the main semiconductor region 3.

The electron supply layer 13 and spacer layer 12 are both so thin that they function as insulators in their own planes but as conductors in a direction normal thereto. As a consequence, when the HEMT is on, electrons flow along the path sequentially comprising the source 4, electron supply layer 13, spacer layer 12, electron transit layer 11, spacer layer 12, electron supply layer 13, and drain 5. The drain current of the HEMT is controlled by the voltage of the gate 6.

The following is a description of a method of fabricating the HEMT in which the first sublayers 8 of the buffer layer 2 are made from AlN, the second buffer sublayers 9 from GaN, and the third buffer sublayers 10 from GaN doped with a p-type impurity.

Figure 3:
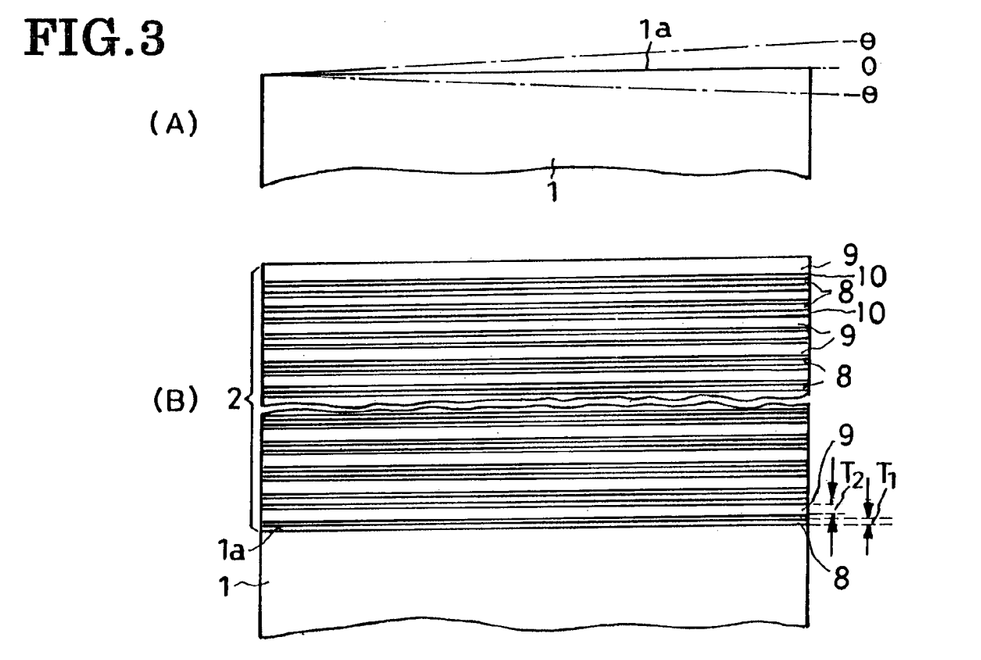
FIG. 3 is a series of sectional views showing successive stages of the fabrication of the HEMT of FIG. 1.

First, as shown at (A) in FIG. 3, there is prepared a substrate 1 in the form of a single crystal of p-type silicon doped with a p-type impurity. The major surface $1_a$ of the silicon substrate 1, on which is to be formed the buffer layer 2, has a crystal face orientation of exactly (111) in terms of Miller indices, although some deviations θ are allowable in either direction from (111). The deviations θ may be four degrees, preferably three degrees, and most desirably two degrees.

With the crystal face orientation of the major surface $1_a$ of the silicon substrate 1 set at or about (111) as above, the buffer layer 2 and main semiconductor region 3 may be epitaxially grown thereon with little or no steps in terms of the magnitude of atoms.

Then, as shown at (B) in FIG. 3, the buffer layer 2 is formed on the major surface $1_a$ of the substrate 1 by repeatedly fabricating the first sublayer 8 of AlN, third sublayer 10 of p-type GaN, and second sublayer 9 of GaN by metalorganic chemical vapor deposition (MOCVD), a type of epitaxial growth. To this end the p-type silicon substrate may be placed in the MOCVD reactor after pretreatment with an HF etchant. The substrate may first be put to 10 minutes thermal annealing at 1100° C. thereby to be stripped of the oxide films from its surfaces. Then one first buffer sublayer 8 of AlN may be formed on the major surface of the substrate 1 to a thickness of five nanometers by charging both trimethyl aluminum (TMA) gas and ammonia ($NH_3$) gas into the reactor for about 30 seconds. Specifically, the substrate 1 was heated to 1100° C., and the TMA gas, or Al, was introduced at about 18 micromoles per minute, and the $NH_3$ gas, or $NH_3$, was introduced at about 0.11 mole per minute.

Then, after terminating the introduction of the TMA gas, one third buffer sublayer 10 of GaN containing Mg as a p-type impurity was formed to a thickness of three to six nanometers by introducing trimethyl gallium (TMG) gas, $NH_3$ gas, and bis-cyclo pentadienylmagnesium ($Cp_2Mg$) gas. The p-type impurity is not limited to Mg; instead, there may be employed any such Group II elements other than Mg as Zn, Sr, Ca, Be, Ba, Cd and Ra.

Then, after terminating the introduction of $Cp_2Mg$ gas, both TMG gas and $NH_3$ gas were introduced into the reactor for about 30 seconds. There was thus crated on the third buffer sublayer 10 the second buffer sublayer 9 of n-type GaN to a thickness of about 20 nanometers. The TMG gas, or Ga, was charged at 70 micromoles per minute, and the $NH_3$ gas, or $NH_3$, at 0.11 mole per minute.

Then another third buffer sublayer 10 was formed by introducing $Cp_2Mg$ gas.

Then another first buffer sublayer 8 was formed on the third buffer sublayer 10.

The fabrication of one first buffer sublayer 8 of AlN and that of one second buffer sublayer 9 of GaN were each repeated twenty times. The fabrication of one third buffer sublayer of p-type GaN 10, interposed between every two neighboring ones of the first and second buffer sublayers 8 and 9, was repeated thirty-nine times. Of course, any other desired numbers of such sublayers could have been formed without departure from the teachings of the invention.

Next came the step of forming on the buffer layer 2 the main semiconductor region 3 for the primary working parts of the HEMT. The substrate 1 with the buffer layer 2 formed thereon was placed in the MOCVD reactor, and both TMG gas and $NH_3$ gas were charged for 10 minutes into the reactor. There was thus formed on the top surface of the buffer layer 2 the electron transit layer 11 of GaN, which is undoped with a conductivity type determinant, to a thickness of about 500 nanometers. The TMG gas (i.e. Ga) was charged at a rate of about 70 micromoles per minute, and the $NH_3$ gas (i.e. $NH_3$) at a rate of about 0.11 mole per minute.

Then The spacer layer 12 of $Al_{0.2}Ga_{0.8}N$, undoped with a conductivity type determinant, was formed on the surface of the electron transit layer 10 to a thickness of seven nanometers by introducing TMA, TMG and $NH_3$ gases into the reactor for 32 seconds. The TMA gas (i.e. Al) was charged at a rate of about 5.8 micromoles per minute, the TMG gas at a rate of about 17 micromoles per minute, and the $NH_3$ gas at a rate of about 0.11 mole per minute.

Then, after suspending the crystal growth for about 15 minutes, there were introduced into the reactor all of TMA, TMG, $NH_3$ and $SiH_4$ gases for about 138 seconds. The electron supply layer 13 of $Al_{0.2}Ga_{0.8}N$ was thus formed on the spacer layer 12 to a thickness of about 30 nanometers. The TMA gas was introduced at a rate of about 5.8 micromoles per minute, the TMG gas at a rate of about 17 micromoles per minute, the $NH_3$ gas at a rate of about 0.11 mole per minute, and the $SiH_4$ gas at a rate of about 21 nanomoles per minute.

By the steps so far described there was obtained a semiconductor wafer constituted a plurality of semiconductor elements each comprising the silicon substrate 1, buffer layer 2 and main semiconductor region 3.

The silicon substrate 1 complete with the buffer layer 2 and main semiconductor region 3 thereon was then withdrawn from the MOCVD apparatus. The insulating film 7 of silicon substrate was formed over the complete surface of the main semiconductor region 3 by plasma CVD. The insulating film 7 was about 250 nanometers thick.

Although only one HEMT is shown in FIG. 1, in practice a multiplicity of HEMTs are made on one semiconductor wafer or substrate 1. The semiconductor wafer must therefore be separated into the individual semiconductor elements by photolithography, such that the main semiconductor region 3 and buffer layer 2 are separated down to the substrate 1 by reactive ion etching using both chlorine ($Cl_2$) and chlorine-based gas mixture. Such separation makes possible accurate determination of the electrical characteristics of each individual element without influence from the other elements.

Then windows for fabrication of a source and drain were created in the insulating film 7 using photolithography and an etchant composed mainly of fluoric acid. Then titanium and aluminum layers were successively formed in lamination by electron beam deposition. The source 4 an drain 5 which were to function as ohmic electrodes were completed by lifting off the unnecessary parts of the deposited layers and thereafter annealing at 650° C. for ten minutes in a nitrogenous atmosphere. The gate 6, which was to function as Schottkey barrier electrode, was formed similarly, by creating a window in the insulating film 7, by creating laminated layers of Ni and Au (or Pd, Ti and Au) by electron beam deposition, and lifting off the unnecessary parts of the deposited layers.

Then the epitaxial wafer was diced into individual semiconductor devices or HEMT chips.

The HEMTs produced as above offer the following advantages:

1. With the third buffer sublayers 10 interposed between the first sublayers 8 and second sublayers 9 of the buffer layer 2 for restricting the generation of two-dimensional electron gas according to the invention, less two-dimensional gas appears than in the prior art wherein the first and second buffer sublayers were in direct contact with each other. Little or no leakage current is therefore to flow through the buffer layer 2, making possible the provision of HEMTs having a high voltage withstanding capability.
2. The main semiconductor region 3 is to develop less cranks from strain as the third buffer sublayers 20 are limited to the range of 0.5 to 50.0 nanometers in thickness, so that the HEMTs have improved electrical characteristics.
3. Including the first sublayers 8 of AlN which is intermediate in lattice constant between silicon and GaN, the buffer layer 2 faithfully conform to the crystal orientation of the silicon substrate 1. As a result, the main semiconductor region 3 of GaN-based semiconductors can be formed on the buffer layer 2 with their crystal orientation in alignment. The main semiconductor region 3 is therefore improved in flatness, and so are the electrical characteristics of the HEMT. Should a buffer layer be made solely from GaN semiconductors at low temperatures on the silicon substrate, a GaN-based semiconductor region would not be formed on the buffer layer with any desired degree of flatness by reason of the great difference in lattice constant between silicon and GaN.
4. The buffer layer 2 of alternating first sublayers 8 of AlN and second sublayers 9 of GaN can be grown at higher temperatures than the prior art low-temperature buffer layer of GaN or AlN alone. Ammonia as a nitrogen source can therefore be decomposed to such an extent that the buffer layer 2 does not become amorphous. Grown epitaxially on this buffer layer 2, the main semiconductor region 3 is sufficiently reduced in the density of crystal defects to prevent leakage current. The resulting HEMT is improved in pinch-off characteristic.

Second Embodiment

Figure 4:
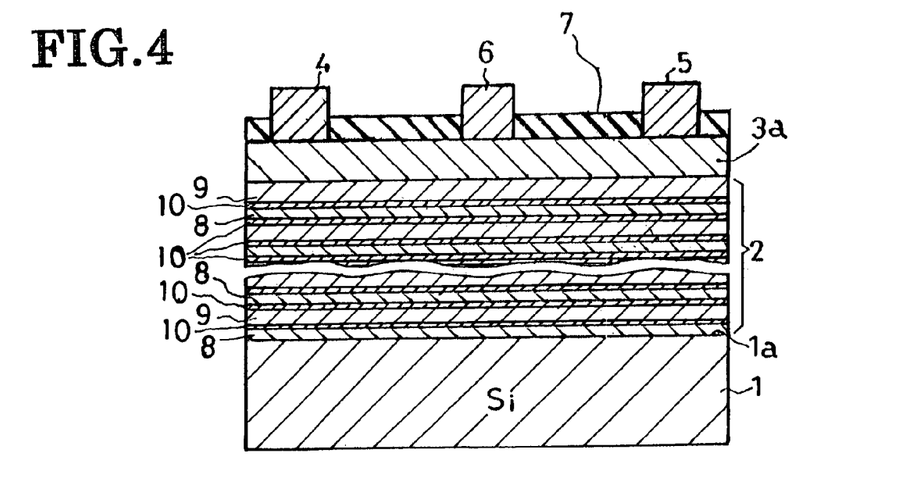
FIG. 4 is a section through a MESFET representing a second preferred embodiment of the invention.

Reference may be had to FIG. 4 for a study of a MESFET embodying the principles of this invention. Like reference characters denote like parts in both FIGS. 1 and 4, and the description of such like parts will be omitted.

The MESFET of FIG. 1 is similar to the HEMT of FIG. 1 except that the main semiconductor region 3 of the latter is modified into an n-type semiconductor region $3_a$ in the form of a layer of a GaN compound semiconductor doped with an n-type impurity of silicon. The MESFET has the silicon substrate 1, buffer layer 2, source 4, drain 5, gate 6 and insulating film 7 which are all equivalent to their FIG. 1 counterparts indicated by the same reference numerals. The n-type semiconductor region $3_a$, which constitutes the primary working part of the MESFET and which might also be termed a channel layer or active layer, overlies the buffer layer 2. Both source 4 and drain 5 make ohmic contact with the n-type semiconductor region $3_a$ whereas the gate 6 makes Schottkey barrier contact with the n-type semiconductor region.

Except for the n-type semiconductor region $3_a$ of GaN, the MESFET of FIG. 4 is manufacturable by the same method as described above in connection with the first embodiment of the invention. For creation of the n-type semiconductor region $3_a$, all of TMG, $NH_3$ and $SiH_4$ gases may be charged for five minutes into the same reactor as that used for fabrication of the buffer layer 2. The n-type semiconductor region $3_a$ will be formed to a thickness of about 250 nanometers on the buffer layer 2 that has been grown as above on the substrate 1. Specifically, the TMG gas (i.e. Ga) may be introduced at about 70 micromoles per minute, the $NH_3$ gas (i.e. $NH_3$) at a rate of 0.11 mole per minute, and the $SiH_4$ gas (i.e. Si) at a rate of 21 nanomoles per minute.

The MESFET thus formed gains advantages similar to those set forth above in connection with the HEMT of FIG. 1. Notable among such advantages are the prevention of the buffer layer 2 from becoming so low in resistance as to permit flow of leakage current, improvements in flatness and crystallinity of the n-type semiconductor region $3_a$, and better characteristics of the MESFET.

Third Embodiment

Figure 5:
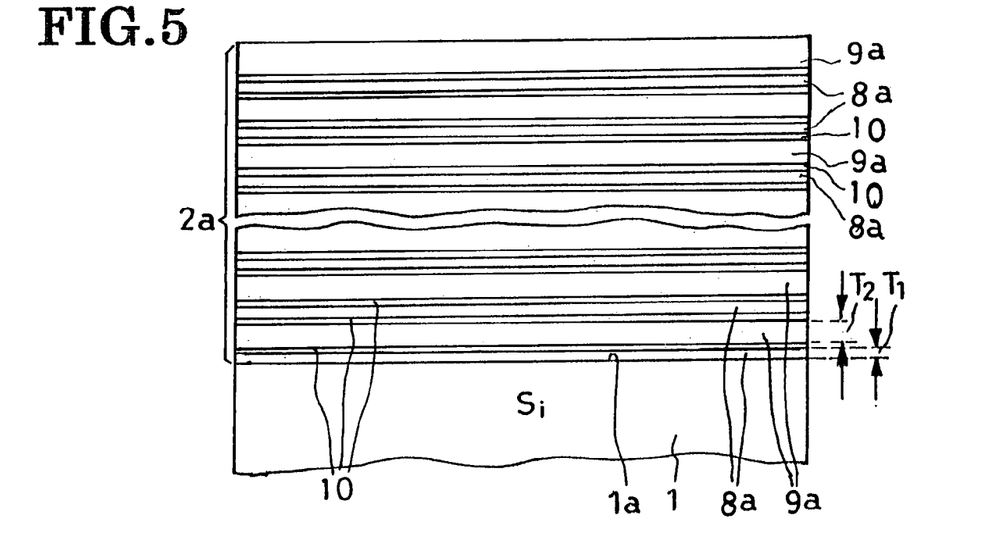
FIG. 5 is a fragmentary section showing a substrate and a buffer layer grown thereon by way of a third preferred embodiment of the invention.

The buffer layer shown in FIG. 5 and therein generally designated $2_a$ represents a modification of the buffer layer 2 of the two preceding embodiments. The modified buffer layer $2_a$ lends itself to use in both HEMT and MESFET as well as any other semiconductor devices. The modified buffer layer $2_a$ features modified first sublayers $8_a$, modified second sublayers $9_a$ and unmodified third sublayers 10 of p-type GaN for two-dimensional electron gas. The arrangement of these buffer sublayers $8_a$, $9_a$ and 10 is the same as that of their counterparts 8-10 in FIGS. 1 and 4.

The modified first buffer sublayers $8_a$ are made from substances that are generally defined as:

where:
 $0 < x \leq 1$;
 $0 \leq y < 1$; and
 $x + y \leq 1$.

No conductivity determinant is added. Examples meeting the above requirements of materials for the modified first buffer sublayers $8_a$ include AlN, AlInN, AlGaN, and AlInGaN. The particular substance employed in this embodiment is $Al_{0.5}In_{0.01}Ga_{0.49}N$ ($x=0.5$ and $y=0.01$ in the formula above). The aluminum-containing modified first buffer sublayers $8_a$ are intermediate in both lattice constant and thermal expansion coefficient between silicon substrate 1 and semiconductor region $3_a$.

The modified second buffer sublayers $9_a$ are made from substances that are generally defined by the following formula and which also are undoped with a conductivity type determinant:

where:

0≦a<1;

0≦b<1;

a+b≦1; and a<x.

Examples of the substances for the modified second buffer sublayers $9_a$ include GaN, AlN, InN, InGaN, AlGaN, AlInN, and AlInGaN. The particular substance employed in this embodiment is $Al_{0.05}In_{0.35}Ga_{0.6}N$ (a=0.05 and b=0.35 in the formula above). The modified second buffer sublayers $9_a$ is greater than the modified first buffer sublayers $8_a$ in the gap between valence band and conduction band. Indium could, however, be contained only in either of the modified first and second buffer sublayers $8_a$ and $9_a$ instead of in both of them.

What follows is the method of fabricating the modified buffer layer $2_a$ of FIG. 5 in the case where the first sublayers $8_a$ are of $Al_{0.5}In_{0.01}Ga_{0.49}N$, the second sublayers $9_a$ of $Al_{0.05}In_{0.35}Ga_{0.6}N$, and the third sublayers 10 of p-type GaN.

The buffer layer $2_a$ was formed on the surface $1_a$ of the substrate 1 as in the first described embodiment of the invention. The first buffer sublayer $8_a$ and second buffer sublayer $9_a$ were alternately grown with the interposition of the third buffer sublayer 10 between every two of them as in FIG. 5. Placed in the MOCVD reactor, the monocrystalline silicon substrate 1 was first put to thermal annealing for removal of its surface oxide films. Then one first sublayer $8_a$ of $Al_{0.5}In_{0.01}Ga_{0.49}N$ was formed on the surface of the substrate 1 to a thickness $T_1$ of about five nanometers (50 angstroms) by introducing the gases of TMA, TMG, TMIn and $NH_3$ into the reactor for about 24 seconds. More specifically, after heating the substrate 1 to 800° C., the TMA gas (i.e. Al) was supplied at about 12 micromoles per minute, the TMG gas at 12 micromoles per minute, the TMIn gas at 47 micromoles per minute, and the $NH_3$ gas (i.e. $NH_3$) at 0.23 mole per minute.

Then one third buffer sublayer 10 of p-type GaN for restricting the generation of two-dimensional electron gas was formed as in the first embodiment of the invention.

Then, after lowering the temperature of the substrate 1 to 750° C., the gases of TMA, TMG, TMIn and $NH_3$ were introduced into the reactor for about 83 seconds. There was thus formed on the third buffer sublayer 10 one second buffer sublayer $9_a$ of $Al_{0.05}In_{0.35}Ga_{0.6}N$ to a thickness $T_2$ of 30 nanometers (300 angstroms). Optionally, the second buffer sublayer $9_a$ could have been doped with silicon by introducing $SiH_4$ gas into the reactor together with the noted gases. The TMA gas was supplied at 2.8 micromoles per minute, the TMG gas at 12 micromoles per minute, the TMI gas at 59 micromoles per minute, and the $NH_3$ gas at 23 moles per minute.

Then another third buffer sublayer 10 was formed as above on the second buffer sublayer $9_a$.

In this particular embodiment there were formed 20 first buffer sublayers $8_a$, 20 second buffer sublayers $9_a$, and 39 third buffer sublayers 10, although other numbers of such sublayers could have been formed as desired or required. It is also possible to interpose the third buffer sublayers 10 only between some selected pairs of first and second buffer sublayers $8_a$ and $9_a$, instead of between all such pairs as in this embodiment.

The modified buffer layer $2_a$ of FIG. 5 offers the same advantages as set forth above in connection with the buffer layer 2. Additionally, by virtue of its indium content, the buffer layer $2_a$ is closer in coefficient of thermal expansion to the silicon substrate 1 than is the buffer layer with no indium content.

Fourth Embodiment

Figure 6:
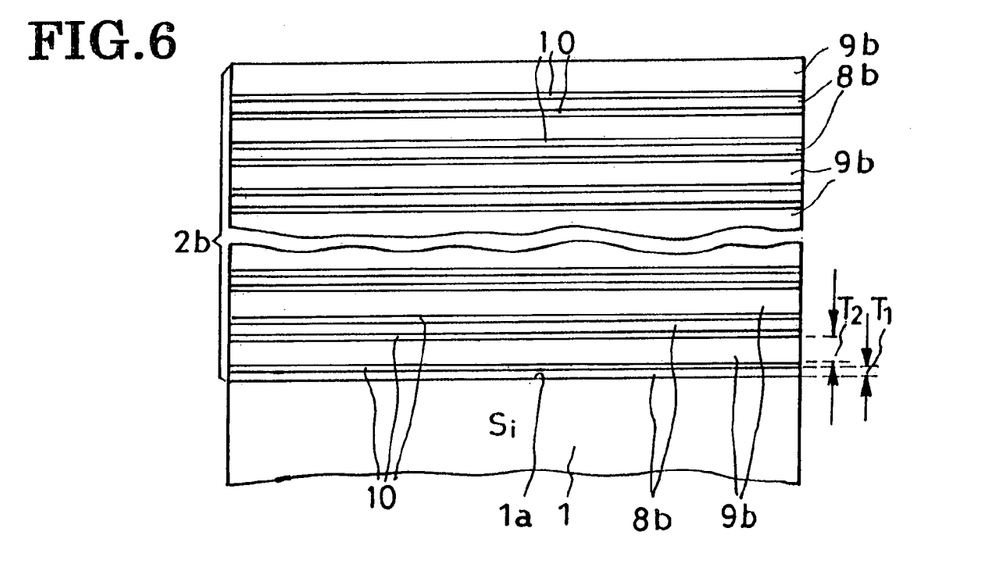
FIG. 6 is a fragmentary section showing a substrate and a buffer layer grown thereon by way of a fourth preferred embodiment of the invention.

FIG. 6 illustrates another modification $2_b$ of the buffer layer 2 shown in both FIGS. 1 and 4. The modified buffer layer $2_b$ incorporates first and second sublayers $8_b$ and $9_b$ of different compositions from their counterparts of the above disclosed buffer layer 2 or $2_a$. The modified buffer layer $2_b$ is similar to the buffer layers 2 and $2_a$ in that the first and second sublayers $8_b$ and $9_b$ alternate via the third sublayers 10 of p-type GaN according to the invention.

The first sublayers $8_b$ of the modified buffer layer $2_b$ are made from substances that are generally defined as:

$Al_xB_yGa_{1-x-y}N$ where:

0<x≦1;

0≦y<1; and x+y≦1.

No conductivity determinant is added. Examples meeting the above requirements of materials for the first sublayers $8_b$ of the modified buffer layer $2_b$ include AlN, AlGaN, AlBN and AlBGaN. The particular substance employed in this embodiment is $Al_{0.5}Ga_{0.5}N$ (x=0.5 and y=0 in the formula above). The first buffer sublayers $8_b$ are closer in both lattice constant and thermal expansion coefficient to the silicon substrate 1 then the second buffer sublayers $9_b$.

The second sublayers $9_b$ of the modified buffer layer $2_b$ are made from substances that are generally defined by the following formula and which also are undoped with a conductivity type determinant:

$Al_aB_bGa_{1-a-b}N$ where:

0≦a<1;

0≦b≦1;

a+b≦1; and a<x.

The possible materials for the second buffer sublayers $9_b$ may be restated as containing at least either of Al, B and G in addition to N. Examples meeting these requirements include GaN, BN, AlN, BGaN, AlGaN, AlBN, and AlBGaN. The particular substance employed in this embodiment is $B_{0.3}Ga_{0.7}N$ (a=0 and b=0.3 in the formula above). The modified second buffer sublayers $9_b$ is greater than the modified first buffer sublayers $8_b$ in the gap between valence band and conduction band. Boron could, however, be contained only in either of the modified first and second buffer sublayers $8_b$ and $9_b$ instead of in both of them.

The modified buffer layer $2_b$ of the foregoing configuration is capable of fabrication by alternately growing the first sublayer $8_b$ of $Al_{0.5}Ga_{0.5}N$ and second sublayer $9_b$ of $B_{0.3}Ga_{0.7}N$ via the third sublayer 10 on the surface $1_a$ of the substrate 1 by MOCVD. For this purpose the substrate 1 of monocrystalline silicon was placed in the MOCVD reactor and stripped of its surface oxide layers by thermal annealing. Then one first sublayer $8_b$ of $Al_{0.5}Ga_{0.5}N$ was formed on the surface of the substrate 1 to a thickness $T_1$ of about five nanometers (50 angstroms) by introducing the gases of TMA, TMG and $NH_3$ into the reactor for about 27 seconds. More specifically, after heating the substrate 1 to 1080° C., the TMA gas (i.e. Al) was supplied at about 12 micromoles per minute, the TMG gas at 12 micromoles per minute, and the $NH_3$ gas (i.e. $NH_3$) at 0.11 mole per minute.

Then one third buffer sublayer 10 of p-type GaN for restricting the generation of two-dimensional electron gas was formed as in the first embodiment of the invention.

Then the gases of triethyl boron (TEB), TMG and $NH_3$ were introduced into the reactor for about 85 seconds, with the result that one second buffer sublayer $9_b$ of n-type $B_{0.3}Ga_{0.7}N$ was formed on the third buffer sublayer 10 to a thickness $T_2$ of 30 nanometers (300 angstroms). Optionally, the second buffer sublayer $9_b$ could have been doped with silicon by introducing $SiH_4$ gas into the reactor together with the noted gases. The TEB gas (i.e. boron) was supplied at seven micromoles per minute, the TMG gas (i.e. gallium) at 16 micromoles per minute, and $NH_3$ gas (i.e. $NH_3$) at 0.11 mole per minute.

Then another third buffer sublayer 10 was formed as above on the second buffer sublayer $9_b$.

In a like manner there were formed a total of 50 first buffer sublayers $8_b$, 50 second buffer sublayers $9_b$, and 99 third buffer sublayers 10 in this particular embodiment, although other numbers of such sublayers could have been formed as desired or required.

The modified buffer layer $2_b$ of FIG. 6 offers the same advantages as set forth above in connection with the buffer layer 2 of FIG. 1. Additionally, by virtue of its boron content, the second sublayers $9_b$ of this buffer layer $2_b$ are sturdier and can be made thicker without cracking.

Fifth Embodiment

Figure 7:
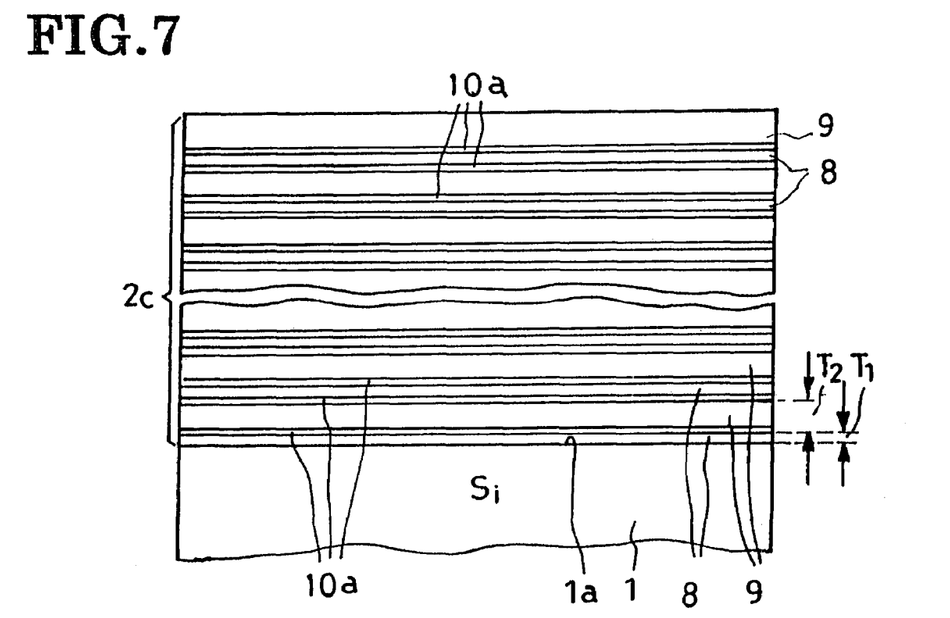
FIG. 7 is a fragmentary section showing a substrate and a buffer layer grown thereon by way of a fifth preferred embodiment of the invention.

FIG. 7 is an illustration of still another modified buffer layer $2_c$ which is similar in construction to that of FIG. 1 except that the third buffer sublayers 10 of p-type GaN in the latter are replaced by third buffer sublayers $10_a$ of electrically insulating material. Interposed between the first and second buffer sublayers 8 and 9 as in all the foregoing embodiments, the insulating third buffer sublayers $10_a$ prevent the first sublayers 8 from straining and reduces the generation of two-dimensional electron gas in the second sublayers 9 as in the first embodiment.

The insulating materials adoptable for the third buffer sublayers $10_a$ include SiN, $SiO_2$, $Al_2O_3$, $Ti_2O_3$, $ZrO_2$ and $Ta_2O_5$. The thickness of the third buffer sublayers $10_a$ should be from 0.5 to 5.0 nanometers, preferably from 0.2 to 2.0 nanometers, in thickness in order to prevent the buffer layer $2_c$ and main semiconductor region 3 from deteriorating in crystallinity. The same insulating materials could be used for the third buffer sublayers of the embodiments shown in FIGS. 4-6. Other advantages gained by this modified buffer layer $2_c$ are as set forth above in conjunction with the preceding embodiments.

Sixth Embodiment

Figure 8:
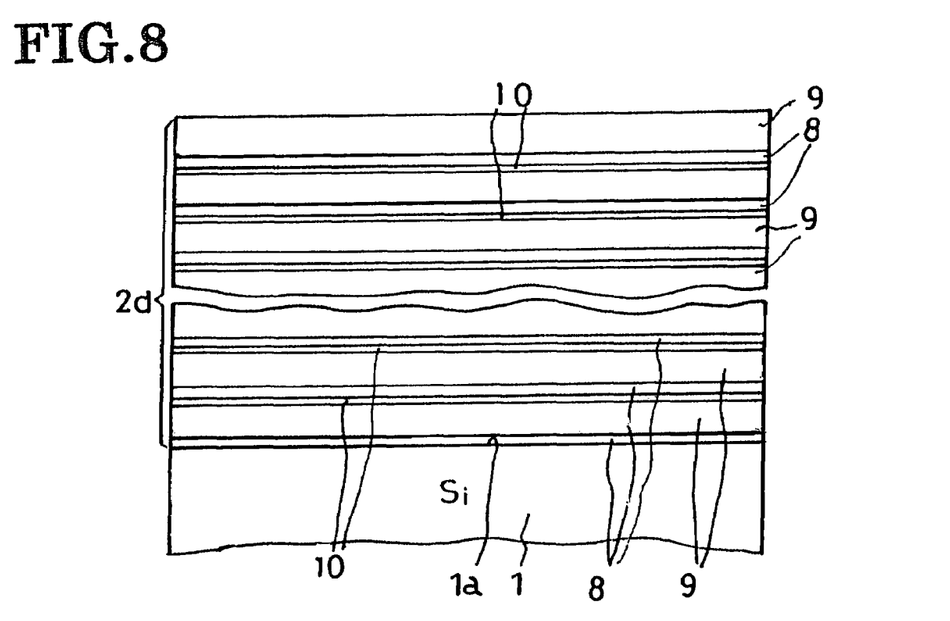
FIG. 8 is a fragmentary section showing a substrate and a buffer layer grown thereon by way of a sixth preferred embodiment of the invention.

A further modified buffer layer $2_d$ given in FIG. 8 incorporates less third sublayers 10 of p-type GaN than does the buffer layer 2 of FIG. 1, all the other details of construction being as previously described in connection with the buffer layer 2. More specifically, in this modified buffer layer $2_d$, the third sublayers 10 are interposed only between each second sublayer 9 and the overlying first sublayer 8, not between each second sublayer and the underlying first sublayer.

Should the third sublayers 10 be totally absent from the buffer layer as in the prior art, the first and second sublayers 8 and 9 would be so stressed that two-dimensional electron gas would arise far more easily between each second sublayer 9 and the overlying first sublayer 8 than between each second sublayer and the underlying first sublayer. Therefore, having the third sublayers 10 arranged as in FIG. 8, the modified buffer layer $2_d$ will gain advantages analogous with those set forth in association with the buffer layer 2 of FIG. 1.

For the same reasons, the third sublayers are omissible from between each second sublayer $9_a$ and the underlying first sublayer $8_a$ in the buffer layer $2_a$ of FIG. 5, from between each second sublayer $9_b$ and the underlying first sublayer $8_b$ in the buffer layer $2_b$ of FIG. 6, and from between each second sublayer 9 and the underlying first sublayer 8 in the buffer layer $2_c$ of FIG. 7.

Possible Modifications

The present invention is not to be limited by the exact details of the foregoing disclosure but admits of a variety of modifications such as the following:

1. The substrate 1 may be made from polycrystalline silicon or from silicon compounds such as SiC, instead of from monocrystalline silicon.
2. The constituent layers of the main semiconductor region 3 or $3_a$ are reversible in conductivity type.
3. The constituent layers of the main semiconductor region 3 or $3_a$ may be made from gallium-nitride- or indium-nitride-based compound semiconductors such as GaN, AlInN, AlGaN, InGaN and AlInGaN.
4. In the HEMT of FIG. 1 an electron supply layer similar to that designated 13 may be provided between buffer layer 2 and electron transit layer 11.
5. The invention is applicable not only to HEMTs and MESFETs but to insulated-gate field-effect-transistors and other semiconductor devices as well.
6. The first sublayers 8, $8_a$ or $8_b$ of the buffer layer 2, $2_a$ or $2_b$ may be made greater in number than the second sublayers 9, $9_a$ or $9_b$ by one so that the first sublayer may constitute the topmost sublayer of the buffer layer. Conversely, the second sublayers 9, $9_a$ or $9_b$ of the buffer layer 2, $2_a$ or $2_b$ may be made greater in number than the first sublayers 8, $8_a$ or $8_b$ by one.
7. The first and second sublayers of the buffer layer 2, $2_a$ or $2_b$ may be doped with impurities to an extent not interfering with their intended functions.

What is claimed is:

1. A semiconductor device comprising:
a substrate of silicon or a silicon compound;
a buffer layer on one of opposite major surfaces of the substrate, the buffer layer having a first sublayer of a nitride semiconductor containing aluminum in a first proportion, a second sublayer of a nitride semiconductor containing aluminum in a second proportion that is either zero or less than the first proportion, and a third sublayer interposed between the first and the second sublayer and made from a substance capable of restricting the generation of two-dimensional electron gas;
a main semiconductor region having at least one nitride semiconductor layer formed on the buffer layer for providing a field-effect transistor, and having a major surface;
a source electrode on the major surface of the main semiconductor region;
a drain electrode on the major surface of the main semiconductor region spaced from the source electrode; and
a gate electrode interposed between the source electrode and the drain electrode on the major surface of the main semiconductor region.

2. A semiconductor device as claimed in claim 1, characterized in that the first sublayer of the buffer layer is made from substances that are generally defined as:

where:
M=at least either of In and B;
$0<x\leq 1$;
$0\leq y<1$; and
$x+y\leq 1$;
that the second sublayer of the buffer layer is made from substances that are generally defined as:

$$Al_aM_bGa_{1-a-b}N$$

where:
M=at least either of In and B;
$0\leq a<1$;
$0\leq b\leq 1$;
$a+b\leq 1$; and
$a<x$; and
that the third sublayer of the buffer layer is from 0.5 to 50.0 nanometers thick.

3. A semiconductor device as claimed in claim 2, characterized in that the first sublayer of the buffer layer is made from substances that are generally defined as:

$$Al_xGa_{1-x}N$$

where $0<x\leq 1$; and
that the second sublayer of the buffer layer is made from substances that are generally defined as:

$$Al_aGa_{1-a}N$$

where $0\leq a<1$, and $a<x$.

4. A semiconductor device as claimed in claim 2, characterized in that the first sublayer of the buffer layer is made from substances that are generally defined as:

$$Al_xIn_yGa_{1-x-y}N$$

where $0<x<1$, $0\leq y<1$, and $x+y\leq 1$;
that the second sublayer of the buffer layer is made from substances that are generally defined as:

$$Al_aIn_bGa_{1-a-b}N$$

where $0\leq a<1$, $0\leq b\leq 1$, $a+b\leq 1$, and $a<x$; and
that indium is contained in at least either of the first sublayer and second sublayer of the buffer layer.

5. A semiconductor device as claimed in claim 2, characterized in that the first sublayer of the buffer layer is made from substances that are generally defined as:

$$Al_xB_yGa_{1-x-y}N$$

where $0<x<1$, $0\leq y<1$, and $x+y\leq 1$;
that the second sublayer of the buffer layer is made from substances that are generally defined as:

$$Al_aB_bGa_{1-a-b}N$$

where $0\leq a<1$, $0\leq b\leq 1$, $a+b\leq 1$, and $a<x$; and
that boron is contained in at least either of the first sublayer and second sublayer of the buffer layer.

6. A semiconductor device as claimed in claim 1, characterized in that the first sublayer of the buffer layer is less in lattice constant than the second sublayer of the buffer layer.

7. A semiconductor device as claimed in claim 1, characterized in that the third sublayer of the buffer layer is less thick than the first sublayer or second sublayer of the buffer layer.

8. A semiconductor device as claimed in claim 1, characterized in that the third sublayer of the buffer layer is made from the same semiconductor material as the second sublayer of the buffer layer, plus a p-type conductivity determinant.

9. A semiconductor device as claimed in claim 1, characterized in that the third sublayer of the buffer layer is made from an electrically insulating material to a thickness ranging from 0.5 to 5.0 nanometers.

10. A semiconductor device as claimed in claim 9, characterized in that the insulating material is at least either of SiN, $SiO_2$, $Al_2O_3$, $Ti_2O_3$, $ZrO_2$ and $Ta_2O_5$.

11. A semiconductor device as claimed in claim 1, characterized in that the buffer layer comprises a plurality of first sublayers and a plurality of second sublayers and at least one third sublayer, that the first and the second sublayers are arranged alternately, and that the third sublayer is interposed between at least one neighboring pair of first and second sublayers.

12. A semiconductor device as claimed in claim 11, characterized in that the third sublayer of the buffer layer is positioned between one second sublayer and that one of the first sublayers which is closer to the main semiconductor region than is said one second buffer sublayer, and not between one second sublayer and that one of the first sublayers which is closer to the substrate than is said one second buffer sublayer.

13. A semiconductor device as claimed in claim 1, characterized in that the first sublayer of the buffer layer is from 0.5 to 50.0 nanometers thick, and that the second sublayer of the buffer layer is from 0.5 to 200.0 nanometers thick.

14. A semiconductor device as claimed in claim 1, characterized in that the surface of the substrate on which is formed the buffer layer has a crystal orientation of (111), or plus or minus four degrees therefrom, in terms of Miller indices.

15. A semiconductor device as claimed in claim 1, characterized in that the nitride semiconductor layer of the main semiconductor region is made from GaN, AlInN, AlGaN, InGaN, or AlInGaN.

16. A semiconductor device as claimed in claim 1, characterized in that the main semiconductor region comprises a plurality of semiconductor layers for providing a high-electron-mobility transistor.

17. A semiconductor device as claimed in claim 1, characterized in that the main semiconductor region comprises a semiconductor layer for providing a metal-semiconductor field-effect transistor.

* * * * *